April 15, 1969 O. H. SCHWARTZ 3,438,273

VHF/UHF TUNING MECHANISM FOR A TELEVISION RECEIVER

Filed Oct. 12, 1967 Sheet 1 of 2

Inventor
Otto H. Schwartz

By Francis W. Crotty
Attorney

VHF/UHF TUNING MECHANISM FOR A TELEVISION RECEIVER

Filed Oct. 12, 1967 Sheet 2 of 2

Inventor
Otto H. Schwartz
By Francis W. Crotty
Attorney

United States Patent Office 3,438,273
Patented Apr. 15, 1969

3,438,273
VHF/UHF TUNING MECHANISM FOR A TELEVISION RECEIVER

Otto H. Schwartz, Glenview, Ill., assignor to Zenith Radio Corporation, Chicago, Ill., a corporation of Delaware Filed Oct. 12, 1967, Ser. No. 674,930
Int. Cl. F16h *35/18;* H03j *1/04, 5/04*
U.S. Cl. 74—10.45 11 Claims

ABSTRACT OF THE DISCLOSURE

The tuning mechanism of a television receiver has a turret type VHF tuner as well as a continuously adjustable UHF tuner and the selector shaft of the turret is geared to the rotor shaft of the continuous tuner. Accordingly, the tuners are uni-controlled to tune over their respective bands simultaneously and in the same sense. There are many more UHF than VHF channels and, therefore, a given angular displacement of the shafts courses through a larger part of the UHF than the VHF spectrum. The nominal stator of the UHF tuner is also adjustable relative to its rotor so that for each preset position of the turret tuner, the additional UHF tuning adjustment permits a selection of any one of a series of six UHF channels.

An indicator arrangement shows the instantaneous adjustment of both the VHF and UHF rotor shafts, designating the selected VHF channel and also the selected group of six UHF channels. A second indicator, controlled by the additional tuning adjustment of the UHF tuner, particularizes as to the effective one of the six UHF channels.

*Background of invention*

The commercially allocated television channels are currently disposed in a VHF and UHF band, the former accommodating channels 2–13 and the latter providing channels 14–83. There is a very significant gap or frequency separation of these two bands which complicates the problem of preset tuning especially in view of existing requirements of the Federal Communications Commission that commercial television receivers be capable of accepting or responding to the broadcast of any channel in either band.

The usual approach to this problem is an arrangement of a VHF tuner, often of the turret type, and a UHF tuner most commonly of the continuously adjustable type. Mechanically, the tuners are independent and each is provided with its own control shaft or channel selector. They are interconnected electrically, however, in such a way that for 12 of 13 detent positions of the turret, that tuner alone is effective and the receiver will have been adjusted to one of the VHF channels. The 13th position of the VHF tuner completes circuitry which connects the UHF tuner in operative relation to the remaining stages of the receiver. The circuit adjustments may also serve to convert some of the stages of the VHF tuner to function as IF amplifiers through which the output of the UHF tuner is applied to the remaining stages of the receiver. In any event, with the VHF tuner in its 13th position, adjustment of the channel selector shaft of the UHF tuner tunes the receiver to any desired and available UHF channel.

This arrangement is quite satisfactory and is currently in wide use. It has the limitation, however, that the tuners are adjustable only sequentially and it is necessary to condition the VHF turret to a specific angular position in order to activate the UHF tuner at all. It has the further difficulty that, unless mechanically complicated and expensive mechanism is associated with the UHF tuner, the convenience of preset tuning is only available for the VHF channels.

Accordingly, it is an object of the invention to provide a novel mechanism for tuning a television receiver to any channel in the VHF and UHF bands.

It is another object of the invention to facilitate preset tuning or channel selection in either band.

It is still a further object of the invention to provide a novel indicating arrangement for a television tuning mechanism.

*Summary of invention*

A mechanism, constructed in accordance with the invention, for tuning a television receiver to any channel in the VHF and UHF bands comprises a first tuner having a displaceable member which is adjustable over a first range to tune the first tuner over the VHF band. A second tuner is provided, having a displaceable member adjustable over a second range to tune the second tuner over the UHF band. A mechanical system interconnects these displaceable members for uni-controlled operation to concurrently adjust both displaceable members in the same sense, thereby to tune both of the tuners over their respective ranges. There are additional means, independent of the aforesaid mechanical system, for tuning the first or second tuner within its assigned frequency band. Finally, there is a switch for selectively enabling one or the other of the tuners.

In a preferred embodiment, the VHF tuner is a turret having a detent for preset tuning and the UHF tuner is continuously adjustable by means of air dielectric tuning capacitors. The rotor of the UHF tuner is mechanically connected for concurrent displacement with the turret and fine tuning is made possible by an additional control which adjusts the tuning capacitors even though the rotor shaft is restrained by the detent action of the VHF turret to which it is mechanically coupled.

The indicator aspect of the invention has a linear VHF dial and a parallel UHF dial. A pointer moves across these dials showing for each position of the turret shaft a selected VHF channel and a selected six channel group of UHF channels. Another portion of the UHF dial, in conjunction with still another pointer, is under the control of the additional or fine UHF tuning arrangement to designate which of the selected group of UHF channels is instantaneously chosen.

*Brief description of the drawings*

The features of the present invention which are believed to be novel are set forth with particularity in the appended claims. The invention, together with further objects and advantages thereof, may best be understood by reference to the following description taken in connection with the accompanying drawings, in the several figures of which like reference numerals identify like elements, and in which:

*Description of the preferred embodiment*

The novelty of the present invention resides in the unique combination of two tuners which, of themselves, may be old and, therefore, need not be described in detail either as to structure or mode of operation. Most particular attention will be directed to their combined arrangement for practicing the present invention to tune a television receiver to any channel in the VHF or UHF bands. Also, no claim of novelty is predicated on stages of the receiver which succeed the tuning stage and they are not to be considered at all except as necessary to indicate an acceptable manner of operatively associating the VHF/UHF mechanism to such other stages of the receiver.

Figures 1, 2, 5:
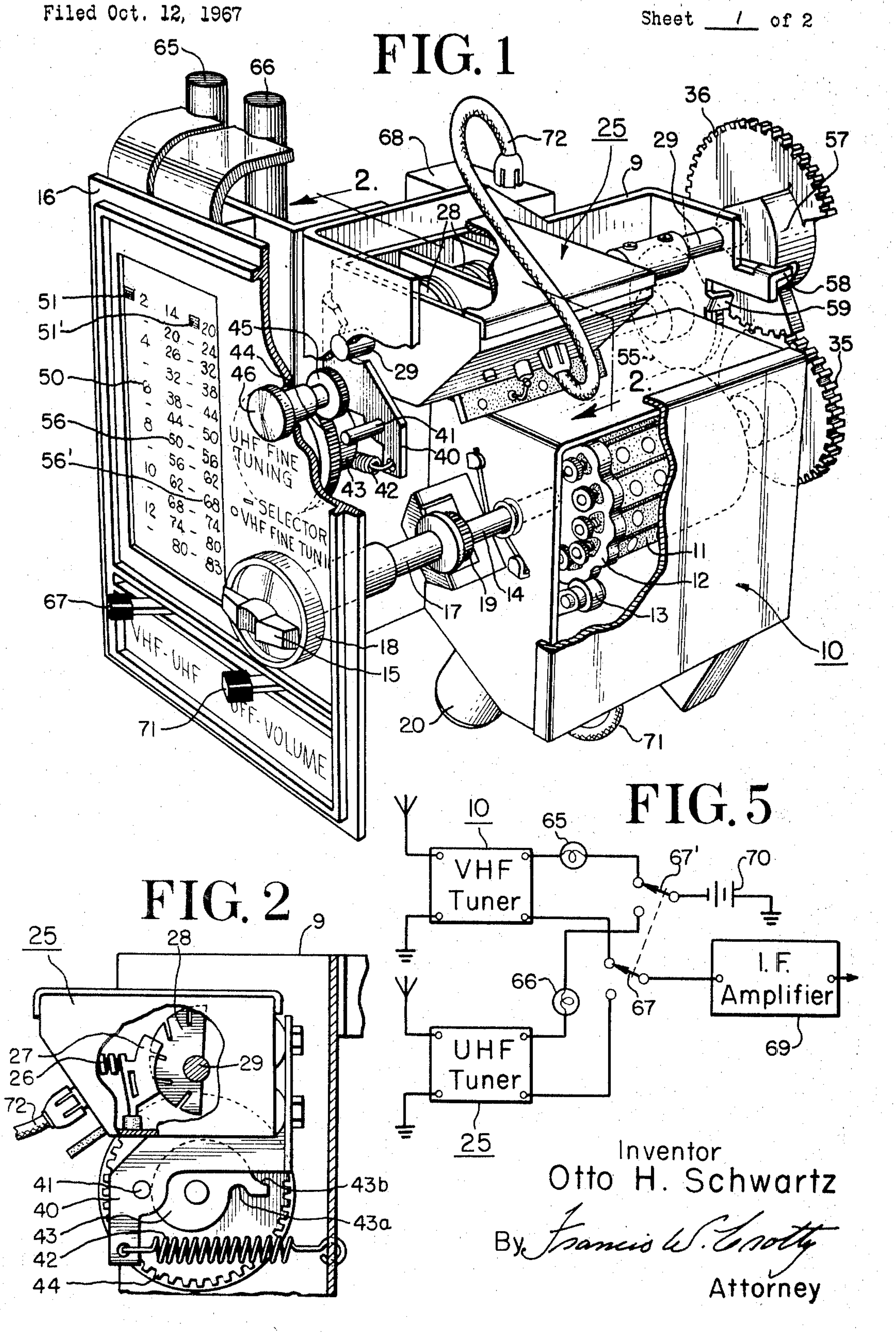
FIGURE 1 is a view, partially broken away, of a mechanism embodying the invention for tuning a television receiver to any channel in the VHF and UHF bands.
FIGURE 2 is a fragmentary view taken along line 2—2 of FIGURE 1 showing details of the UHF tuner.
FIGURE 5 is a schematic diagram indicating the manner in which the tuner of FIGURE 1 may be functionally associated with the remaining stages of a television receiver.

Referring now more particularly to FIGURE 1, the tuning mechansm comprises a first or turret tuner 10 which, for example, may be constructed as disclosed in Patent 3,144,626, issued Aug. 11, 1964, in the name of O. H. Schwartz and assigned to the assignee of the present invention. Its turret 11 has a series of channel strips each of which is tuned to one of the VHF channels. This turrent is a displaceable member which is adjustable over a fixed angular range to tune throughout the entire VHF band. Since linear channel indicators are employed, as made clear hereafter, the rotational range of turret 11 is slightly less than 360° and preset tuning is available by means of the usual detent mechanism which releasably restrains the turret in preselected positions within its displacement range. One component of the detent mechanism is the scalloped-like end plate 12 of the turret which cooperates with the usual detent roller 13 that is supported on a stationary component of the assembly. Turret 11 is supported on a channel selector shaft 14 which extends through the front panel of the receiver and terminates in a channel selector knob 15. Only a portion 16 of the front panel of the receiver has been shown.

It is desirable to provide fine tuning of the channel strips constituting turret 11 and accordingly, a fine tuning shaft 17 is concentric with and rotatable relative to selector shaft 14. The end of shaft 17 which projects through panel 16 carries a fine tuning knob 18 and the opposite end of this shaft terminates in a gear 19 which may connect with a fine tuning tool as disclosed in Schwartz Patent 3,144,626.

As is customary, turret 11 is contained within a shield housing which also supports the active devices, such as tube 20, for completing not only the input selector stages but also the heterodyning oscillator and oscillator modulator stages characteristic of a superheterodyne type of receiver. The electrical function of the tuner is the conversion of a television program signal received over a selected VHF channel into an output signal of the proper intermediate frequency for application to the intermediate frequency amplifier of the receiver.

The second or UHF tuner 25 of the arrangement under consideration is of the continuously adjustable type preferably constructed as disclosed in a copending application, Ser. No. 343,281, filed Feb. 7, 1967 in the name of Wayne H. Reynolds and likewise assigned to the assignee of this invention. It has an enclosure or shield housing with internal partitions defining RF, oscillator and modulator stages. Each stage is tunable by means of a selector of the type represented in FIGURE 2. It has a coil 26 fixed at one end to the shield housing and terminating at its opposite end in an electrode element 27 which is normally stationary. There is a cooperating electrode or rotor 28 secured to a tuning shaft 29 and displaceable thereby over the angular range required continuously to tune UHF tuner 25 over the entire UHF band. Of course, the selectors of the three stages constituting UHF tuner 25 have such relative tuning that the output signal of the UHF tuner is also an intermediate frequency signal suitable for application to the IF amplifier of the receiver. It desired, the final stage of the UHF tuner may be an amplifier tuned to the IF.

A mechanical system interconnects the displaceable turret 11 of VHF tuner 10 and rotor shaft 29 of UHF tuner 25 for uni-controlled operation to concurrently adjust both of these displaceable members in the same sense in order to tune both tuners over their respective ranges. This system comprises a gear 35 rotatable with channel selector shaft 14 of the VHF tuner and coupled in mechanical engagement with a gear 36 secured to rotor shaft 29 of the UHF tuner. The dimensioning of gears 35, 36 is chosen to the end that displacement of turret 11 throughout its 12 detent positions, corresponding to the 12 VHF channel allocations, displaces rotor shaft 29 and tunes UHF tuner 25 over all 70 of the UHF channels. From this, it is clear that displacing channel selector shaft 14 the angular amount required to tune from one VHF channel to the next displaces the tuning shaft of the UHF tuner over a number of UHF channels, specifically 6 channels. Accordingly, it is necessary to provide additional tuning means for the UHF tuner in order to be able to select a desired one of this group of six available channels while its rotor shaft 29 is restrained against movement by detent 13.

A convenient form of auxiliary tuning feature is described and claimed in an application of Eugene Polley et al. Ser. No. 674,961, filed concurrently herewith and assigned to the assignee of the present invention. This arrangement is shown in FIGURE 1 and features mounting the enclosure of the UHF tuner for rotational displacement about rotor shaft 29. The housing carries a plate 40 from which extends a cam following pin 41 which is urged by a spring 42 into engagement with a cam 43 secured to one face of gear 44. That gear, in turn, is in mesh with gear 45 carried at the free end of a UHF fine tuning shaft which extends through panel 16 to receive a UHF fine tuning knob 46. Rotation of knob 46 advances cam 43 so that its increasing radius displaces plate 40, the housing of the UHF tuner and each stator electrode 27 in a counterclockwise direction as viewed in FIGURE 1, displacing these elements against the bias of spring 42. The rotational range of cam 43 is restricted to approximately 360° by abutment surfaces **43*a* and 43*b* which engage pin 41** to define the limits of the rotational range.

At the same time, the displacement range of electrode 27 and the tuning capability available by rotation of the housing of the UHF tuner which is determined by the throw of cam 43 must be at least equal to the frequency adjustment of UHF tuner 25 occasioned by the angular displacement between two successive detent positions of turret 11. More specifically, since the turret has detent positions for each of the 12 VHF channels, the fine tuning adjustment available with control 46 should cover a range which represents that portion of the UHF band coresponding to the angular adjustment of the mechanical interconnection system for two successive VHF channel selections. In numbers of channels, this works out to be a requirement that control 46 be able to tune tuner 25 over a frequency range corresponding to the allocation of six consecutive UHF channels. Since the channel assignments are uniform throughout the band, this is a requirement for all detent positions of the overall tuning arrangement.

Figures 3, 4:
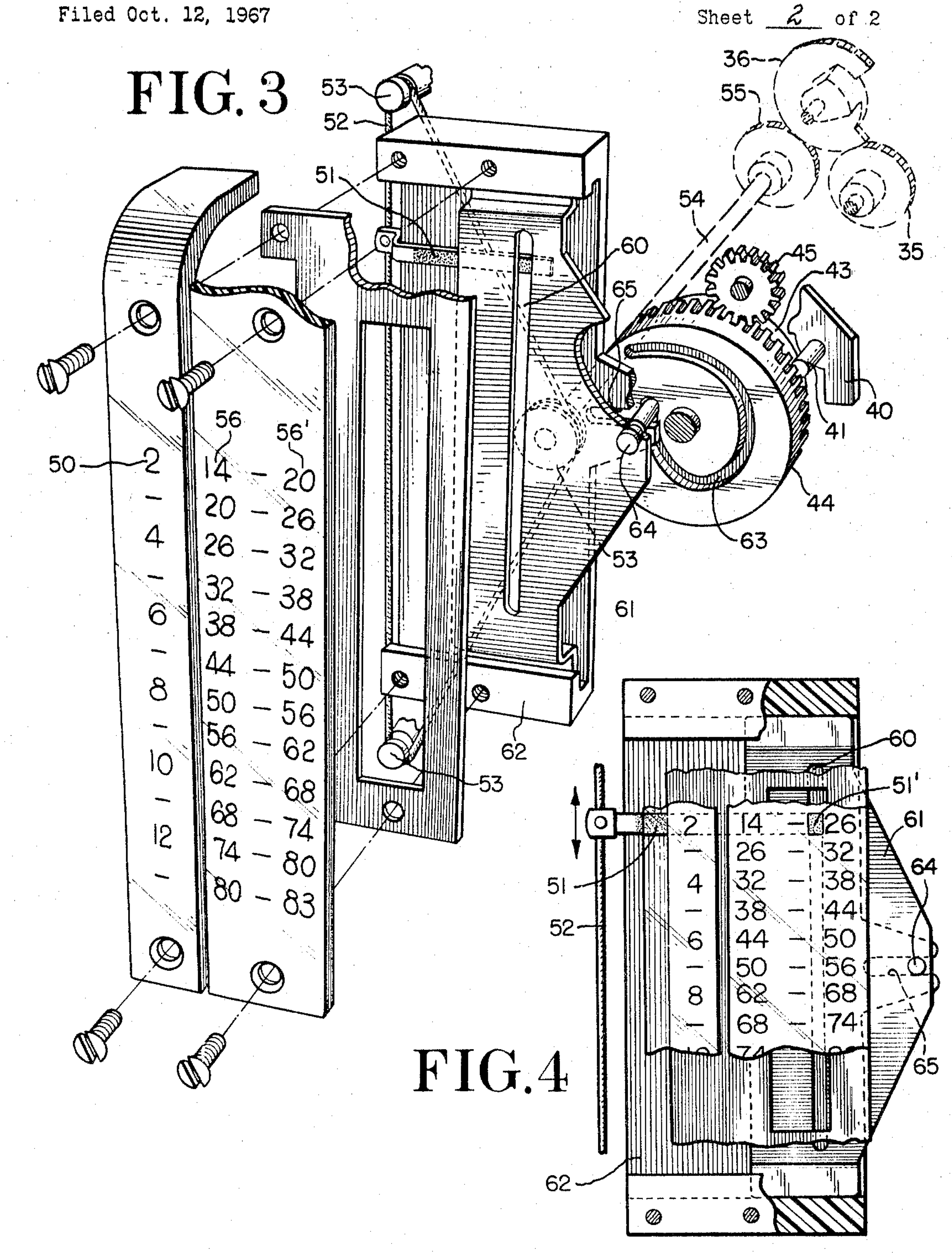
FIGURE 3 is an exploded view of the mechanism involved in channel indication for both the VHF and UHF bands.
FIGURE 4 is a detail of that indicating mechanism.

Of course, it is most desirable that channel indication be provided for both the VHF and UHF bands. For this purpose, panel 16 bears a VHF channel indicator having a scale 50 calibrated from 2 to 13 and a pointer 51 is movable over that scale in synchronism with the displacement of turret 11 in response to adjustment of channel selector knob 15. Pointer 51, as shown in FIGURE 3, is secured to a continuous cable 52 which passes over guides or pulleys 53 one of which is mounted on one end of a shaft 54 carrying a gear 55 at its free end with is in meshing engagement with gear 36 and, therefore, is driven whenever VHF channel selector 15 is adjusted.

As stated earlier, the use of a linear channel scale restricts the mechanical system to a rotational range not exceeding 360°. For this purpose, gear 36 carries on one face a stop device 57 which may engage a cooperating fixed stop element 58 at one end of the rotational range and a second stationary stop device 59 at the other end of that range. Stop elements 58, 59 are part of the frame structure 9 of the tuning mechanism. The indication of the effective UHF channel is more difficult since, as explained above, each VHF channel selecting position makes available a group of six UHF channels. Accordingly, the UHF indicator has one series 56 of scale divisions relating the UHF tuning condition to the manipulations of the mechanical system common to both tuners. These divisions are arranged parallel to the VHF scale 50 but consecutive divisions show a separation of six channels of the series 14 to 80.

Another portion of the UHF scale extends at right angles to the series 56 as will be apparent from the top line including channel indication 2 of scale 50, channel 14 of scale 56 and farther to the right a channel indication 20. The scale segment subtended by channel designations 14 to 20 is the portion of particular interest and as the numerals indicate, represents a spread of six UHF channel designations. There is a pointer to identify the particular one of this group of six channels to which the UHF system is instantaneously adjusted. The mechanism shows most clearly in FIGURES 3 and 4 wherein the pointer is in the form of a slot 60 which extends parallel to scales 50 and 56 and is cut from a plate 61 positioned in front of pointer 51 to reveal a portion 51′ of the latter as an indication of UHF channel selection. This plate is supported for sliding movement from a stationary structure 62 which has rails to accept the upper and lower terminations of plate 61 as illustrated in FIGURE 3.

Movement of plate 61 along its rails is under the control of a spiral cam 63 which is cut in the face of gear 44 opposite to that which bears cam 43. A pin 64 projecting from plate 61 extends through a slot or raceway 65 milled in a side projection of the support structure 62 and is received in cam track 63. Wtih cam 63 in the position shown, plate 61 is in its extreme position on the right side of the guideways of its support 62 but as cam 63 is rotated in a clockwise direction for approximately 360°, the cam track displaces pin 64 along with its plate 61 to its other extreme position at the left side of its support 62. Rotation of cam 63 is, of course, controlled by UHF fine tuning adjustment 46 which rotates gear 45, in turn mechanically coupled to gear 44. In other words, with VHF tuner 10 adjusted as indicated in FIGURE 1 to select channel 2, there is available for selection channels 14–20 of the UHF band. The one that is chosen is designated by the position of slot 60 which reveals a small portion 51′ of pointer 51 within the scale designation subtended by channel numerals 14–20. Manipulations of UHF fine tuning control 46 permits selection of any channels within the series and positions pointer section 51′ accordingly. This same type of 6-channel UHF scale is provided for each channel selection position of knob 15 as is evident by scale 56′.

It should be noted in passing that gear 44 may conveniently be supported by any stationary part of the mechanism, for example, structure 62. The details of its mount have been omitted simply to avoid confusion in the drawings.

Cylinders 65 and 66 of FIGURE 1 designate housings for channel indication lights. Channel light 65 illuminates VHF scale 50 and channel light 66 illuminates UHF scales 56 and 56′.

Obviously, it is inappropriate to have both the VHF and UHF tuners operative at the same time. Accordingly, there is a switch 67 for selectively enabling one or the other. The switch, other than its operating handle 67 may be mounted in an enclosure 68 to which cable connections 71, 72 extend from the output terminals of tuners 10 and 25, respectively. It is a conventional single pole double throw switch to selectively connect either tuner through an IF amplifier to the remaining stages of the receiver. This is indicated schematically in FIGURE 5 where switch 67 connects with IF amplifier 69. Another switch 67′ uni-controlled with switch 67 selectively connects channel light 65 or channel light 66 with a potential source 70 so that the appropriate channel indicator scale is illuminated at the same time a given one of the pairs of tuners is operatively connected into the following stages of the receiver.

To operate the described tuning mechanism, an on-off switch 71, available at the front panel 16, is actuated to its on position to energize the receiver stages, including both tuners 10 and 25. If the tuners are transistorized, there is little excess power drain in having both tuners energized whenever the receiver is turned on even though only one tuner is effective at a time. If they are both energized, band selector switch 67 permits an instantaneous change from VHF to UHF reception.

Having energized the receiver and determined whether the reception is to be of a VHF or UHF channel, switch 67 is properly set and the channel is selected first by operation of VHF selector knob 15. This gives direct selection if reception is desired of a channel in the VHF band. For reception of a channel in the UHF band, one adjusts selector 15 until indicator 51′ appears in the UHF channel grouping which includes the particular channel desired. At that time, UHF fine tuning selector 46 is manipulated, if necessary, to tune to the particular channel. Of course, for reception of that channel, it is necessary that selector switch 67 be adjusted to its UHF position.

For reception of a channel in either band, one of lamps 65, 66 is energized and the appropriate scale is, therefore, illuminated. The effective tuner provides an intermediate frequency signal representing the received program which is delivered through IF amplifier 69 to the remaining stages of the receiver which respond in the usual way to effect reproduction of both the video and sound portions.

While a particular embodiment of the invention has been shown and described, it will be obvious to those skilled in the art that changes and modifications may be made without departing from the invention in its broader aspects.

I claim:

1. A mechanism for tuning a television receiver to any channel in the VHF and UHF bands comprising:

a first tuner having a displaceable member which is adjustable over a first range to tune said first tuner over said VHF band;

a second tuner having a displaceable member which is adjustable over a second range to tune said second tuner over said UHF band;

a mechanical system interconnecting said displaceable members of said first and second tuners for uni-controlled operation to concurrently adjust both of said displaceable members in the same sense and tune both of said tuners over their respective ranges;

additional means, independent of said mechanical system, for tuning said first or second tuner within its assigned frequency band;

and a switch for selectively enabling one or the other of said tuners.

2. A tuning mechanism in accordance with claim 1 including a detent mechanism for releasably restraining said displaceable members in at least one preselected position in their displacement ranges to tune one of said tuners to to a particular channel within its operating band, and in which said tuning means tunes the other of said tuners to a channel within its assigned band while the displaceable member thereof is restrained by said detent mechanism.

3. A tuning mechanism in accordance with claim 2 in which said detent mechanism releasably restrains said displaceable elements in at least two positions in their displacement ranges to tune to two VHF channels and in which the tuning range of said additional tuning means is at least equal to the frequency adjustment of said UHF tuner corresponding to said two positions of said displaceable member of said UHF tuner established by said detent mechanism.

4. A tuning mechanism in accordance with claim 3 in which said VHF tuner is of the turret type having preset tuning conditions established by said detent mechanism and in which said UHF tuner is of the continuously adjustable type including a pair of relatively displaceable elements the positions of which determine the condition of tuning, in which the position of one of said elements is determined by said mechanical system while the position of the other of said elements is determined by said additional tuning means.

5. A tuning mechanism in accordance with claim 2 including a VHF channel indicator having a scale and a first pointer which is movable over said scale in synchronism with said displaceable member of said VHF tuner to designate the condition of VHF tuning, including a UHF channel indicator having a scale with divisions in one direction relating the UHF tuning condition to manipulations of said mechanical system and divisions in another direction relating the UHF tuning condition to manipulations of said additional tuning means, and further including said first pointer which is movable over said UHF scale in said one direction in synchronism with said displaceable member of said UHF tuner and another pointer which is movable over said UHF scale in said other direction in synchronism with adjustment of said additional tuning means.

6. A tuning mechanism in accordance with claim 5 in which said divisions of said UHF scale arranged in said one direction are parallel to said VHF scale and in which said first pointer moves over said parallel scales in synchronism with the movement of said displaceable members.

7. A tuning mechanism in accordance with claim 6 in which said other divisions of said UHF scale extend at right angles to said parallel scales, in which said first pointer extends parallel to and coextensive with said other divisions, and in which said other pointer is a plate positioned in front of said other pointer and having a transparent portion disposed parallel to said parallel scales to reveal a portion of said first pointer as determined by manipulation of said additional tuning means.

8. A tuning mechanism in accordance with claim 7 in which the tuning condition of said UHF tuner is determined by the relative positions of two displaceable elements, one of said elements being connected with said mechanical system and with said first pointer and the other of said elements being connected with said additional tuning means and with said plate.

9. A tuning mechanism in accordance with claim 5 including a pair of channel lights, one for each of said channel indicators, which are selectively energized concurrently with the selective enabling of said tuners.

10. A mechanism for tuning a television receiver to any selected one of a series of channels within a frequency band comprising:

frequency-selective means for tuning to any of said channels comprising a pair of relatively moveable members the positions of which determine the condition of tuning;

a pre-set control system coupled to said frequency-selective means for establishing said members in any one of a number of pre-set positions representing the selection of a corresponding number of channels which are spaced from one another in said band by an amount equal to the frequency allocation of a plurality of channels;

an auxiliary control system coupled to said frequency-selective means for displacing said members from any of said preset positions to tune to channels intermediate those represented by said pre-set positions;

an indicator including a channel scale, a pointer movable over said scale in response to said pre-set control system for indicating said pre-set channels and further including another pointer movable over said scale in response to said auxiliary control system for indicating said intermediate channels.

11. A tuning mechanism in accordance with claim 10 in which said pre-set control system moves one of said pair of members and in which said auxiliary control system moves the other member of said pair.

References Cited

UNITED STATES PATENTS

| | | | |
|---|---|---|---|
| 2,761,321 | 9/1956 | Bieze | 74—10.5 |
| 2,839,936 | 6/1958 | Dawson | 74—10.45 X |
| 2,873,610 | 2/1959 | Williams | 74—10.45 |
| 3,270,571 | 9/1966 | Leedom | 74—10.8 X |
| 3,365,962 | 1/1968 | Smith | 74—10.52 X |

MILTON KAUFMAN, *Primary Examiner.*

U.S. Cl. X.R.

74—10.5, 10.6, 10.8; 334—51; 116—124.1